US006806026B2

(12) United States Patent
Allen et al.

(10) Patent No.: US 6,806,026 B2
(45) Date of Patent: Oct. 19, 2004

(54) PHOTORESIST COMPOSITION

(75) Inventors: Robert David Allen, San Jose, CA (US); Gregory Breyta, San Jose, CA (US); Phillip Brock, Sunnyvale, CA (US); Richard A. DiPietro, Campbell, CA (US); Debra Fenzel-Alexander, San Jose, CA (US); Carl Larson, San Jose, CA (US); David R. Medeiros, Kitchawan, NY (US); Dirk Pfeiffer, Dobbs Ferry, NY (US); Ratnam Sooriyakumaran, San Jose, CA (US); Hoa D. Truong, San Jose, CA (US); Gregory M. Wallraff, Morgan Hill, CA (US)

(73) Assignee: International Business Machines Corporation, Armonk, NY (US)

( * ) Notice: Subject to any disclaimer, the term of this patent is extended or adjusted under 35 U.S.C. 154(b) by 158 days.

(21) Appl. No.: 10/159,635

(22) Filed: May 31, 2002

(65) Prior Publication Data

US 2003/0224283 A1 Dec. 4, 2003

(51) Int. Cl.[7] ........................ G03F 7/039; G03F 7/038; G03F 7/32; G03F 7/38; C08J 3/28
(52) U.S. Cl. ................... 430/270.1; 430/311; 430/325; 430/326; 430/327; 430/907; 430/323; 522/154; 522/156
(58) Field of Search ............................. 430/270.1, 311, 430/325–327, 907, 323; 522/156, 154

(56) References Cited

U.S. PATENT DOCUMENTS

| | | | |
|---|---|---|---|
| 6,027,856 A | 2/2000 | Nozaki et al. | |
| 6,074,801 A | 6/2000 | Iwasa et al. | |
| 6,106,998 A | 8/2000 | Maeda et al. | |
| 6,140,010 A | 10/2000 | Iwasa et al. | |
| 6,146,806 A | 11/2000 | Maeda et al. | |
| 6,265,135 B1 | 7/2001 | Kodama et al. | |
| 6,319,650 B1 | 11/2001 | Gelorme et al. | |
| 6,503,686 B1 * | 1/2003 | Fryd et al. | 430/907 |
| 6,511,787 B2 * | 1/2003 | Harada et al. | 430/907 |
| 6,548,219 B2 * | 4/2003 | Ito et al. | 430/907 |
| 6,610,456 B2 * | 8/2003 | Allen et al. | 430/270.1 |
| 2002/0061464 A1 * | 5/2002 | Aoai et al. | 430/270.1 |
| 2002/0155376 A1 * | 10/2002 | Hashimoto et al. | 430/270.1 |

OTHER PUBLICATIONS

Y.C. Bae et al., "Rejuvenation of 248 nm Resist Backbones for 157 nm Lithography," Journal of Photopolymer Science and Technology, vol. 14, No. 4, pp. 613–620, 2001.
T.H. Fedynyshyn et al., "High Resolution Fluorocarbon Based Resist for 157–nm Lithography," Advances in Resist Technology and Processing XVIII, Francis M. Houlihan, Editor, Proceedings of SPIE, vol. 4345, pp. 296–307, 2001.
H. Ito et al., "Polymer Design for 157 nm Chemically Amplified Resists," Advances in Resist Technology and Processing XVIII, Francis M. Houlihan, Editor, Proceedings of SPIE, vol. 4345, pp. 273–284, 2001.
R.R. Kunz et al., "Experimental VUV Absorbance Study of Fluorine–Functionalized Polystyrenes," Advances in Resist Technology and Processing XVIII, Francis M. Houlihan, Editor, Proceedings of SPIE, vol. 4345, pp. 285–295, 2001.

* cited by examiner

Primary Examiner—Richard L. Schilling
(74) Attorney, Agent, or Firm—Ryan, Mason & Lewis, LLP; Daniel P. Morris, Esq.

(57) ABSTRACT

A photoresist composition is provided that includes a polymer having at least one acrylate or methacrylate monomer having a formula:

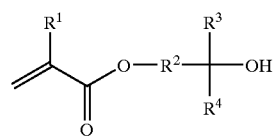

I where $R^1$ represents hydrogen (H), a linear or branched alkyl group of 1 to 20 carbons, or a semi- or perfluorinated linear or branched alkyl group of 1 to 20 carbons; and where $R^2$ represents an unsubstituted aliphatic group or a substituted aliphatic group having zero or one trifluoromethyl ($CF_3$) group attached to each carbon of the substituted aliphatic group, or a substituted or unsubstituted aromatic group; and where $R^3$ represents hydrogen (H), methyl ($CH_3$), trifluoromethyl ($CF_3$), difluoromethyl ($CHF_2$), fluoromethyl ($CH_2F$), or a semi- or perfluorinated aliphatic chain; and where $R^4$ represents trifluoromethyl ($CF_3$), difluoromethyl ($CHF_2$), fluoromethyl ($CH_2F$), or a semi- or perfluorinated substituted or unsubstituted aliphatic group. A method of patterning a substrate using the photoresist composition is also provided herein.

69 Claims, No Drawings

PHOTORESIST COMPOSITION

FIELD OF THE INVENTION

The present invention relates to a photoresist composition and, more particularly, to a photoresist composition that includes a polymer having at least one monomer that includes an acrylate or methacrylate group and further includes at least one fluoro alcohol group.

BACKGROUND OF THE INVENTION

The patterning of radiation sensitive polymeric films with high energy radiation such as photons, electrons or ion beams is the principle means of defining high resolution circuitry found in semiconductor devices. The radiation sensitive films, often referred to as photoresists regardless of the radiation source, generally consist of multicomponent formulations that are usually spin-cast onto a desired substrate such as a silicon wafer. The radiation is most commonly ultraviolet light of the wavelengths of 436, 365, 257, 248, 193 or 157 nanometers (nm), or a beam of electrons or ions, or 'soft' x-ray radiation, also referred to as extreme ultraviolet (EUV) or x-rays. The radiation is exposed patternwise and induces a chemical transformation to occur that renders the solubility of the exposed regions of the films different from that of the unexposed areas when the films are treated with an appropriate developer, usually a dilute, basic aqueous solution, such as aqueous tetramethylammonium hydroxide (TMAH).

Photoresists are generally comprised of a polymeric matrix, a radiation sensitive component, a casting solvent, and other performance enhancing additives. The highest performing photoresists in terms of sensitivity to radiation and resolution capability are the group of photoresists termed "chemically amplified." Chemically amplified photoresists allow for high resolution, high contrast and high sensitivity that are not afforded in other photoresists. These photoresists are based on a catalytic mechanism that allows a relatively large number of chemical events such as, for example, deprotection reactions in the case of positive photoresists or crosslinking reactions in the case of negative tone photoresists, to be brought about by the application of a relatively low dose of radiation that induces formation of the catalyst, often a strong acid. The nature of the functional groups that comprise the polymeric matrix of these photoresists dictates the tone of the photoresist (positive or negative) as well as the ultimate performance attributes.

The nature of the polymeric matrix also dictates the suitability of a given photoresist for exposure with particular radiation sources. That is, the absorbance characteristics of a polymer must be carefully considered when designing a material for lithographic applications. This is important with optical lithography where polymers are chosen to provide a relatively transparent matrix for radiation-sensitive compounds such as photoacid generators (PAGs). Absorbance characteristics are also important because the wavelength of radiation used in optical lithography is directly proportional to the ultimate resolution attainable with a photoresist. The desire for higher resolution causes a continuing drive to shorter and shorter radiation wavelengths. For example, the phenolic polymers used for 248 nm imaging, namely derivatives of poly(4-hydroxystyrene) or PHS, are unsuitable for use with 193 nm radiation as the opacity of these PHS materials at 193 nm does not allow for sufficient radiation to create an appropriate image profile throughout the photoresist film thickness. Therefore, material selection and creation is necessary for each wavelength of optical radiation used.

In addition to absorbance characteristics, another parameter to be considered in the design of new photoresist materials is the dissolution behavior of the material in the given developer. The semiconductor industry has largely supported the use of 0.263 normal (N) TMAH as a developer for photoresist. The aforementioned PHS materials used in 248 nm imaging have a distinct and beneficial31property in that these materials tend to dissolve very uniformly in 0.263 N TMAH, without swelling. Additionally, the rate at which the polymeric films dissolve can be tuned by the use of, for example, protecting groups and dissolution inhibitors in positive tone photoresists, and by effective crosslinking and other functionalization in negative tone photoresists. This property of uniform dissolution has been a difficult property to incorporate into new photoresist materials, especially those designed specifically for 193 nm imaging. The current polymer platforms chosen for 193 nm imaging, such as acrylic acid derivatives, cyclic olefins and alternating cyclic olefin-maleic anhydride-based materials, generally fall into this category of nonlinear dissolution. In fact, these materials often exhibit significant swelling during the initial stages of development. This has made the development of photoresists based on these materials quite challenging, particularly so for negative tone formulations.

Alternative materials based on fluoroalcohols have been previously proposed as a means of providing aqueous base solubility. See, e.g., H. Ito et al., "Polymer Design for 157 nm Chemcially Amplified Resists," *Proc. SPIE*, 4345:273–284 (2001); R. R. Kunz et al., "Experimental VUV Absorbance Study of Fluorine-Functionalized Polystyrenes," *Proc. SPIE*, 4345:285–295 (2001); and Y. C. Bae et. al., "Rejunvination of 248 nm Resist Backbones for 157 nm Lithography," *J. Photopolym. Sci. Tech.*, 14:613–620 (2001). Examples of such materials include norbornene hexafluoroalcohol, styrene hexafluoroalcohol and cyclohexyldodecylfluoroalcohol-based polymers. While each of these platforms provides base-soluble materials, each has disadvantages for commercial high resolution photoresist applications. The norbornene hexafluoroalcohol monomer requires special polymerization conditions, such as ring-opening polymerization, transition metal catalyzed addition polymerization, or alternating free-radical polymerization with a comonomer such as maleic anhydride. Thus, this monomer does not accommodate a large number of suitable comonomers; a desirable property which allows for a large degree of variation in composition, and thereby, materials properties. The styrene hexafluoroalcohol-based polymers are not suitable for imaging with 193 nm radiation due to their opacity at this wavelength, as with other styrenic materials such as PHS. The cyclohexyldodecylfluoroalcohol acrylates suffer from their high degree of synthetic complexity thus rendering their manufacture prohibitively expensive.

Accordingly, a need exists for new, practical compositions that can provide the desired characteristics for high resolution photoresist applications.

SUMMARY OF THE INVENTION

In a first aspect of the invention, a photoresist composition is provided. The composition includes a polymer having at least one monomer having a formula:

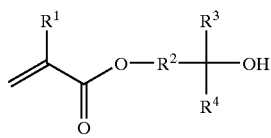

I where $R^1$ represents hydrogen (H), a linear or branched alkyl group of 1 to 20 carbons, or a semi- or perfluorinated linear or branched alkyl group of 1 to 20 carbons; and where $R^2$ represents an unsubstituted aliphatic group, or a substituted aliphatic group having zero or one trifluoromethyl ($CF_3$) group attached to each carbon of the substituted aliphatic group, or a substituted or unsubstituted aromatic group; and where $R^3$ represents hydrogen (H), methyl ($CH_3$), trifluoromethyl ($CF_3$), difluoromethyl ($CHF_2$), fluoromethyl ($CH_2F$), or a semi- or perfluorinated aliphatic group; and where $R^4$ represents trifluoromethyl ($CF_3$), difluoromethyl ($CHF_2$), fluoromethyl ($CH_2F$), or a semi- or perfluorinated substituted or unsubstituted aliphatic group.

The composition can further include at least one of a solvent, photoacid generator, crosslinking agent, basic compound, surfactant, latent basic compound, photobase generator, dissolution inhibitor, dissolution accelerator, adhesion promoter, and defoaming agent. These additional materials can be included to provide desired properties. A crosslinking agent can be included, for example, in a negative tone photoresist, or an agent containing an acid labile group can be included, for example, in a positive tone photoresist.

The photoresist can also include a co-monomer that does not fall within the formula set forth above. The co-monomers can be selected based upon the properties desired in the photoresist composition. For example, certain co-monomers can provide crosslinking groups desired in a negative tone photoresist. Other co-monomers can provide properties desired in a positive photoresist. Still other co-monomers can provide properties desirable in either a positive or negative tone photoresist, such as regulation of dissolution properties, thermal properties, and etch resistance.

In another aspect of the invention, a novel composition is provided. The composition includes a polymerizable monomer selected from the group consisting of 1,1,1-trifluoro-2-trifluoromethyl-2-hydroxy-5-pentyl methacrylate; 1,1,1-trifluoro-2-trifluoromethyl-2-hydroxy-4-pentyl methacrylate; 2-{[5-(1',1',1'-trifluoro-2'-trifluoromethyl-2'-hydroxy)propyl]norbornyl]} methacrylate; or analogous acrylate monomers each thereof. A composition is also provided that includes a polymerizable monomer selected from the group consisting of 3-furfuryloxy-2-hydroxyprop-1-yl methacrylate; 6-methacryloxymethyl-2-naphthol; 2-methacryloxy-6-hydroxymethylnaphthalene; or analogous acrylate monomers each thereof.

In another aspect of the invention, a method of patterning a substrate is provided. The method includes applying a photoresist composition as described above to form a film, patternwise exposing the film to an imaging radiation source, and developing areas of the composition exposed to the radiation source. The method can further include etching the patterned substrate, for example, using ion etching.

A distinction of these acrylate and methacrylate materials over others used in lithographic photoresist formulations is the incorporation of the fluorinated alcohols as the base-solubilizing moiety. These materials can have a pKa similar to that of the aforementioned phenolic materials (pKa ~9–11) and thus can exhibit similar dissolution characteristics in TMAH. This is in contrast to the acrylic acid or carboxylic acid derivatives that are often currently employed, which rely on the alkali solubility of the acid functionalities, which are significantly stronger acids (pKa ~3–6) and thus have distinct dissolution characteristics.

The acrylate-based or methacrylate-based compositions of the invention provide several distinct advantages over conventional materials. Firstly, a variety of synthetic variations are easily attainable through modification of the ester functionality. Secondly, these monomers readily undergo free-radical polymerization and are amenable to free-radical copolymerization with other co-monomers. Free radical polymerization is desirable as the functional group tolerance of this means of polymerization is high and control of molecular weight and polydispersity is facile. Thirdly, polymers derived from acrylate or methacrylate monomers are generally quite soluble in conventional casting solvents and form high quality, uniform films when cast on conventional substrates.

The photoresist compositions of the invention offer the ease of synthetic variation and polymerization afforded by acrylates or methacrylates with the superior dissolution characteristics offered by fluoro alcohols. The variety of materials described in this application have been incorporated into both positive and negative tone photoresists that allow high resolution patterning with 193 nm optical radiation. Furthermore, the performance of such resists can be extended by including blends of fluoro alcohol acrylate polymers with other similar or dissimilar polymers in the resist formulation.

DETAILED DESCRIPTION OF PREFERRED EMBODIMENTS

A new family of acrylate and methacrylate based photoresist compositions are provided herein. The photoresist compositions of the invention include a polymer comprising a monomer having a polymerizable acrylate or methacrylate group. It is to be understood that, although a monomer may be described herein as a particular methacrylate, the monomers are defined herein to include the analogous acrylate formula, and vice versa.

The polymer in the photoresist composition is the reaction product of a plurality of monomers. The monomers can be polymerized by conventional means to form a polymer. The polymer will typically have a molecular weight between about 500 to about 500,000 daltons, preferably between about 1,000 to about 100,000 daltons, most preferably between about 5,000 to about 50,000.

For example, the desired monomers can be dissolved in an appropriate solvent that, at reflux, will afford a medium that maintains a constant temperature suitable for activation of the chosen initiator without inducing side reactions amongst the functional groups of the monomers. The solution can be prepared so as to afford a relatively high concentration of monomer, for example 30 wt %. The chosen initiator is then added and the solution is degassed by bubbling with dry nitrogen. The reaction flask is then immersed in preheated oil bath and allowed to reflux for several hours. After cooling the solution to room temperature, the polymer is isolated by precipitation into an excess volume, for example twenty-fold, of an appropriate nonsolvent. The polymer is isolated by filtration, washed with the nonsolvent and dried to constant weight under vacuum.

The photoresist compositions of the present invention may be prepared by combining the components (e.g., polymer, crosslinking agent, solvent, acid generator, base, and/or auxiliary components) using conventional methods known to those skilled in the art. For example, the polymeric material can be dissolved in an appropriate casting solvent along with performance enhancing additives such as, but not limited to, photoacid generators, crosslinking agents, basic compounds, surfactants, latent basic compounds, photobase generators, dissolution inhibitors, dissolution accelerators, adhesion promoters or defoaming agent. In general, these other components, when used, preferably comprise less than about 10 wt % of the photoresist composition, and most preferably less than about 1 wt % of the photoresist composition. Once all components are dissolved and distributed in the solution, the solution is filtered and optionally treated with, for example, ion exchanging media, so as to remove undesired components such as trace acids, bases or metals.

The acrylate or methacrylate monomer can be represented by the general formula:

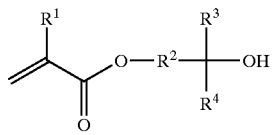
I where $R^1$ represents hydrogen (H); a linear or branched alkyl group of 1 to 20 carbons, such as methyl ($CH_3$), a semi- or perfluorinated linear or branched alkyl group of 1 to 20 carbons, such as trifluoromethyl ($CF_3$), chlorine (Cl), fluorine (F), or carbonitrile (CN); and where $R^2$ represents an unsubstituted aliphatic group or a substituted aliphatic group having one trifluoromethyl ($CF_3$) group, if any, attached to each carbon of the substituted aliphatic group, the aliphatic group preferably having between 1 and 30 carbons, such as propyl or isopropyl, or a substituted or unsubstituted aromatic group, preferably having between 5 and 20 carbons, such as phenyl or naphthyl; and where $R^3$ represents hydrogen (H), methyl ($CH_3$), trifluoromethyl ($CF_3$), difluoromethyl ($CHF_2$), fluoromethyl ($CH_2F$), or a semi- or perfluorinated aliphatic group, preferably having between 2 and 20 carbons; and where $R^4$ represents trifluoromethyl ($CF_3$), difluoromethyl ($CHF_2$), fluoromethyl ($CH_2F$), or a semi- or perfluorinated substituted or unsubstituted aliphatic group, preferably having between 2 and 20 carbons. $R^3$ and $R^4$ may be similar or dissimilar.

The aliphatic group is defined herein to include a substituted or unsubstituted cycloaliphatic group. For example, cycloaliphatic groups suitable for $R^2$ preferably have between 3 and 30 carbons, such as norbornylmethyl, norbornyl, adamantyl, and cyclohexyl. Similarly, the aliphatic groups of $R^3$ and $R^4$ are defined herein to include cycloaliphatic groups.

The monomers as defined herein are intended to include derivatives thereof. For example, a methylene group of the acrylate or methacrylate group can be optionally substituted with one or more halogens, such as F, Cl or Br. In addition, as indicated above, the aliphatic, cycloaliphatic, and aromatic groups may optionally be substituted with one or more halogens, such as F, Cl or Br or other functional groups such as hydroxyl (—OH), oxo (=O), or nitrile (—CN).

In a preferred embodiment, the monomer is one of the following novel monomers having the formula:

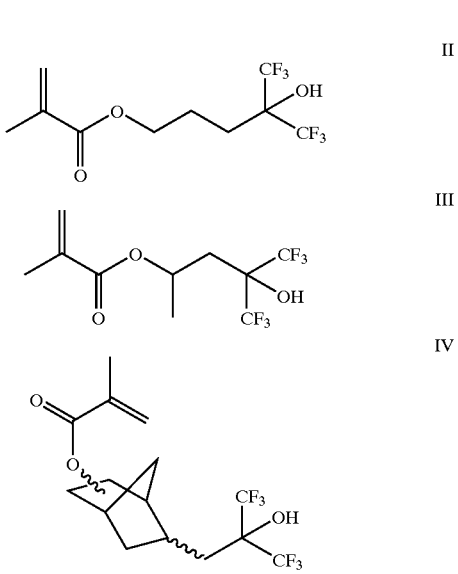

1,1,1-trifluoro-2-trifluoromethyl-2-hydroxy-5-pentyl methacrylate (II), 1,1,1-trifluoro-2-trifluoromethyl-2-hydroxy-4-pentyl methacrylate (III), or 2-{[5-(1',1',1'-trifluoro-2'-trifluoromethyl-2'-hydroxy)propyl] norbornyl]} methacrylate (IV) or their analogous acrylate monomers. These novel monomers are set forth as a separate embodiment of the invention.

The monomers can be produced using conventional techniques. For example, the dianion of the corresponding diol can be generated by reaction with two equivalents of an appropriately strong base, such as n-butyllithium, in a polar aprotic solvent, such as tetrahydrofuran, at reduced temperature, such as −15° C. To this solution is added one equivalent, relative to the parent diol, of methacryloyl chloride (or acryloyl chloride or a analogous derivative thereof) added dropwise at reduced temperature, for example 10° C. After slowly warming to room temperature and dilution with a solvent that is immiscible with water, such as diethyl ether, the organic solution is washed twice with saturated ammonium chloride, washed twice with brine and then dried over magnesium sulfate. After removal of the drying agent by filtration, the solvent is removed by rotary evaporation, a small portion of an inhibitor, such as phenothiazine is added, and the desired product is distilled under reduced pressure.

If unavailable, the diol from above can be generated from the analogous olefinic fluorocarbinol by, for example, hydroboration followed by oxidation with base and hydrogen peroxide and subsequent neutralization.

Alternatively, the methacrylate or acrylate monomer can be derived from a parent olefinic fluoroalcohol by regioselective hydrohalogenation, such as hydrobromination, using hydrobromic acid, followed by displacement with the carboxylate anion of the corresponding acrylic or methacrylic acid, which can be generated from the acid with an appropriate strong, hindered base such as 1,8-diazabicyclo[5.4.0]-7-undecene (DBU) or triethylamine.

Alternatively, methacrylic acid or acrylic acid or an analogous derivative thereof can be directly added to an olefinic fluorocarbinol under catalytic acidic conditions using a conventional mineral acid. For example, the olefinic fluorocarbinol and excess methacrylic acid can be dissolved in a polar aprotic solvent, such as diethyl ether, and one tenth of an equivalent of a concentrated strong acid, such as sulfuric acid, is added dropwise. The solution is heated to reflux for several hours, cooled to room temperature, and diluted with tetrahydrofuran (THF). The solution is then cautiously added to a 1 M solution of sodium bicarbonate and stirred. The organic portion is extracted with diethyl ether and washed with saturated sodium bicarbonate, followed by brine, and then dried over magnesium sulfate. After removal of the drying agent by filtration, the solvent is removed by rotary evaporation, a small portion of an inhibitor, such as phenothiazine is added, and the desired product is distilled under reduced pressure.

In another alternative for producing the monomer, methacrylic acid or acrylic acid or an analogous derivative thereof can be directly added to an olefinic fluorocarbinol under catalytic acidic conditions using a heteropolyacid or a heteropolyacid hydrate. For example, one equivalent each of an olefinic fluorocarbinol and methacrylic acid is dissolved in a polar aprotic solvent, such as methyl ethyl ketone, and one one-hundredth of an equivalent of a heteropolyacid hydrate, such as phosphotungstic acid hydrate, is added dropwise. The solution is heated, for example to 60° C., for several hours, cooled to room temperature, and diluted with diethyl ether. The solution is then cautiously added to a 10% (w/v) solution of sodium bicarbonate and stirred. The phases are separated and the organic portion is washed with brine, and then dried over sodium sulfate. After removal of the drying agent by filtration, the solution is stirred at room temperature with activated carbon. After removal of the carbon by filtration through a filter-aid, the solvent is removed by rotary evaporation, a small portion of an inhibitor, such as phenothiazine is added, and the desired product is distilled under reduced pressure.

The photoresist composition of the invention can be utilized as a negative photoresist. In the case of negative tone photoresists, the exposed regions of the patterned film are rendered less soluble in a developer, typically an aqueous alkali developer, than the exposed areas. Thus, the polymeric matrix of a negative tone photoresist formulation contains an inherently soluble material that is transformed into an insoluble material by means of a catalytic mechanism, often including radiation-generated strong acid.

The nature of this catalytic mechanism can include crosslinking reactions that convert the discrete polymer chains of the parent photoresist into an insoluble network. This mechanism includes a catalytic mechanism that at least increases the molecular mass of the polymeric chains of the photoresist to a point where they are effectively no longer soluble in the developer solution. Alternatively, the mechanism may involve the chemical transformation of the solubilizing moieties of the parent photoresist polymer into insoluble functionalities.

When the photoresist composition is to be used as a negative photoresist, a crosslinking agent may be added, for example, during resist formulation. Examples of such crosslinking agents include, but are not limited to, glycouril, melamine, epoxide, furyl, tetrahydrofuryl, vinyl ether, and combinations thereof. Preferred examples of glycouril include a glycouril having a formula:

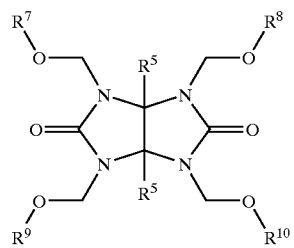

wherein $R^5$, $R^6$, $R^7$, $R^8$, $R^9$ and $R^{10}$ each represent hydrogen (H), an aliphatic, or aromatic group. Examples of such aliphatic groups include methyl, ethyl, propyl or isopropyl. Examples of such aromatic groups include phenyl. One particular example of a suitable glycouril is POWDERLINK® 1174 available from Cytec (West Paterson, N.J.).

The photoresist compositions of the invention can also be utilized as a positive tone photoresist. Positive tone photoresists typically comprise a polymeric matrix that is essentially a protected form of a material that is intrinsically soluble in the developer, but is rendered insoluble by the blocking or protecting groups. These groups can be catalytically acid labile functionalities. For example, in compositions of the invention, the fluoro alcohol group of the monomers may be protected by substituting the hydrogen of at least one fluoro alcohol group with acid labile groups such as t-alkyl carbonate, t-alkyl ester, t-alkyl ether, acetal or ketal. Alternatively, the fluoro alcohol containing monomers can be co-polymerized with other monomers that contain acid labile moieties.

The protecting group may be removed to generate a developer-soluble material by formation of strong acid. This may be accomplished by the imagewise exposure to the appropriate radiation and the subsequent generation of acid by the radiation-sensitive components of the photoresist formulation, for example a photoacid generator (PAG)—a material that is specifically designed to decompose to form strong acid upon exposure to the appropriate radiation. The degree of protection can be chosen to most effectively modulate the dissolution characteristics of the material in aqueous alkali developer such that unexposed cast films of the material are insoluble and exposed areas are rendered soluble by deprotection of the aforementioned acid labile groups.

After exposure, a thermal treatment can be applied to afford sufficient deprotection of the protecting groups. Upon treatment with developer, the exposed regions that have been rendered soluble can be dissolved away leaving a patterned film of the unexposed areas of the photoresist.

In an alternative embodiment, the polymer within the photoresist composition of the invention can contain other monomers that are not represented by the acrylate or methacrylate monomer of formula I. These other monomers are referred to herein as "co-monomers." The monomers of formula I and co-monomers not represented by formula I can be co-polymerized by conventional means. In addition, polymers containing monomers of formula I and polymers containing co-monomers that are not represented by formula I can be "blended" by known means, for example, during photoresist formulation, to form the photoresist composition of the invention.

The co-monomers can be selected based upon the properties desired in the photoresist composition. For example, when monomers and co-monomers are polymerized to form a polymer for a negative photoresist composition of the invention, crosslinking groups can be included as part of the co-monomer. A crosslinking group as defined herein involves a functionality, which, upon treatment with a catalyst, exposes an electrophilic center or centers capable of subsequent reaction with an intrinsic, polymeric nucleophile. This reaction induces a solubility change among the affected polymer chains rendering them insoluble in basic developer. Examples of such co-monomers include:

separate crosslinking agent can be added during photoresist formulation. Preferably, such a crosslinking agent attaches to the polymer of the resist composition through the nucleophile during processing. As discussed above, examples of such crosslinking agents include but are not limited to glycouril, melamine, epoxide, and vinyl ether, and combinations thereof. Examples of such nucleophilic co-monomers include:

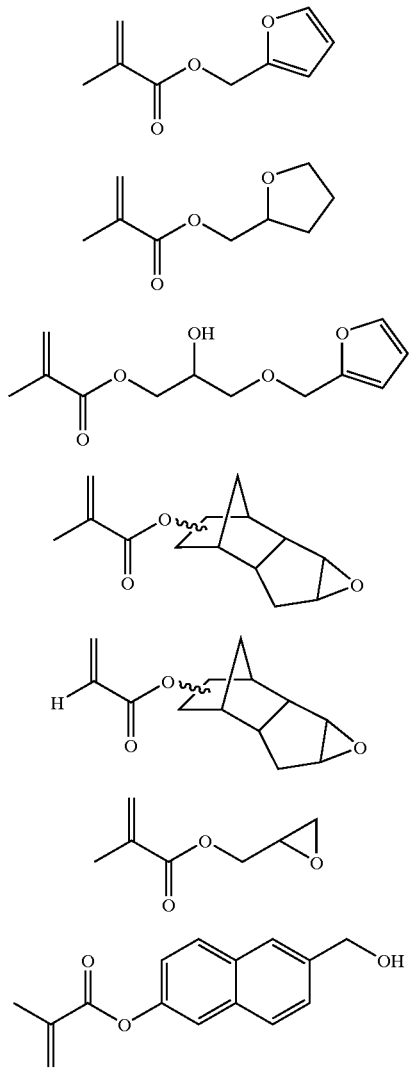
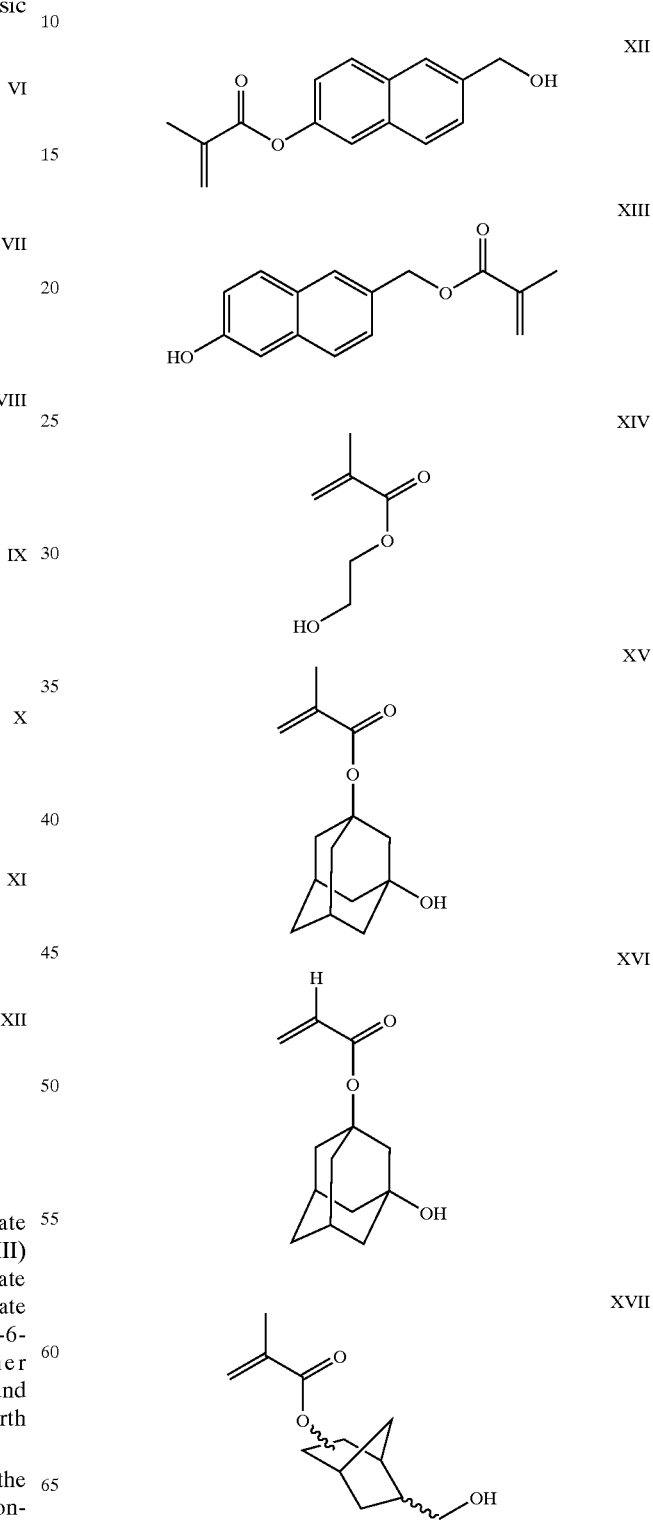

furfurylmethacrylate (VI), tetrahydrofurfurylmethacrylate (VII), 3-furfuryloxy-2-hydroxyprop-1-yl methacrylate VIII) tetracyclo[5.2.1.0$^{2,7}$.0$^{4,6}$]-5-oxo-undecanyl-10-methacrylate (IX) tetracyclo[5.2.1.0$^{2,7}$.0$^{4,6}$]-5-oxo-undecanyl-10-acrylate (X), glycidylmethacrylate (XI), or 2-methacryloxy-6-hydroxymethylnaphthalene (XII). Co-monomer 3-furfuryloxy-2-hydroxyprop-1-yl methacrylate (VIII) and its analogous acrylate are novel monomers and are set forth as a separate embodiment herein.

Additionally, in a negative photoresist composition, the monomers can be polymerized with co-monomers that contain a nucleophilic site, such as an alcohol. In such cases, a

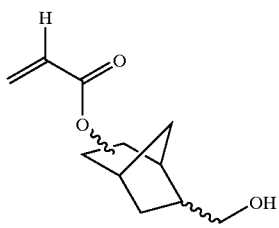

XVIII 2-methacryloxy-6-hydroxymethylnaphthalene (XII), 6-methacryloxymethyl-2-naphthol (XIII), 2-hydroxyethylmethacrylate (XIV), 3-hydroxy-1-adamantylmethacrylate (XV), 3-hydroxy-1-adamantylacrylate (XVI), 2-methacryloxy-5-hydroxymethylnorbornane (XVII), or 2-acryloxy-5-hydroxymethylnorbornane (XVIII). Co-monomers 2-methacryloxy-6-hydroxymethylnaphthalene (XII) and 6-methacryloxymethyl-2-naphthol (XIII) are novel monomers and are set forth as a separate embodiment herein.

Similarly, specific co-monomers can be selected for use in a positive tone photoresist. Such monomers can be chosen from the group of monomers that contain acid labile moieties such as tertiary alkyl carbonates, tertiary alkyl esters, tertiary alkyl ethers, acetals or ketals. Examples of such co-monomers include the following:

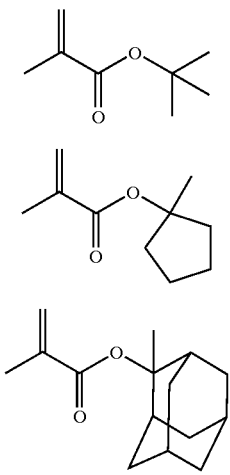

t-butylmethacrylate (XIX), 1-methylcyclopentylmethacrylate (XX), or 2-methyl-2-adamantylmethacrylate (XXI).

Similarly, specific co-monomers can be selected for use in either negative or positive tone photoresists. For example, such co-monomers can contain at least one polar group, such as lactone, sulfonamide, anhydride, and carboxylic acid. Such groups can, for example, allow for the regulation of dissolution properties, thermal properties and etch resistance. For example, the co-monomer can include acrylic acid and/or methacrylic acid to acclerate dissolution of unexposed resist. Examples of co-monomers that include at least one polar group include:

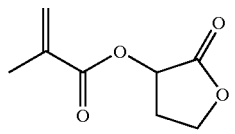

α-methacryloyloxy-γ-butyrolactone (XXII) or 5-methacryloyloxy-2,6-norbornanecarbolactone (XXIII).

As with the acrylate or methacrylate fluoro alcohol monomers of formula I, the co-monomers can be produced using conventional methods. For example, the parent alcohol of co-monomer can be reacted with methacryloyl chloride or acryloyl chloride or the derivative thereof after forming the anion of the alcohol or, in the cases where the parent alcohol is a diol, the corresponding dianion, using one or two equivalents, respectively, of an appropriately strong base, as described above regarding the manufacture of the monomers of formula I. Product work-up and isolation can also proceed in an analogous manner. When functional group intolerance precludes this procedure, the employment of the appropriate protection-deprotection schemes may be necessary to prevent side reactions.

The photoresist compositions of the present invention are particularly useful as radiation-sensitive photoresists employed in the manufacture of electronic parts, especially semiconductor devices, or in the manufacture of photolithography masks using optical, electron beam, ion beam or x-ray radiation. Moreover, the compositions of the present invention may be employed for patterning printed circuit boards or photolithographic masks (i.e., photomasks), micromachining, the fabrication of microfluidic cells, or other related practices that require the definition of high resolution patterns.

The present invention encompasses a method of patterning a desired substrate, such as, for example, a silicon wafer, a chrome-on-glass mask blank, or a printed circuit board. The method includes applying to the substrate a coating of photoresist composition containing a polymer having an acrylate or methacrylate monomer of formula I, as described above, to form a film. The photoresist material can be applied by known means, such as spin casting.

The method also includes patternwise exposing the photoresist composition to an imaging radiation source, such as ultraviolet radiation of 193 or 157 nm. The areas of the photoresist exposed to the radiation source are then developed by, for example, immersion, puddle development, or other processes known to those skilled in the art. Developer solution can include, for example, dilute aqueous alkali solution, which may or may not contain a surfactant.

In the case of positive tone photoresists, the exposed areas of the film will be rendered soluble in the developer and can be washed away, leaving a pattern of the unexposed areas. In negative tone photoresists, the exposed areas of the film will be rendered insoluble and will remain after development of the unexposed areas. The developed image can then be rinsed with water to remove excess developer and dried. The patterned photoresist image can then be used as an etch mask for subsequent image transfer into the underlying substrate.

Pre-application, post-application, post-exposure, and post-development processes such as, for example, application of an anti-reflective coating, substrate priming, baking, flood exposure, or vapor treatment, may also be incorporated into the methodologies of the invention at least in part to enhance the performance and/or advantages of the present invention, as is known in the art. In particular, the incorporation of a post-application bake (PAB) to remove residual casting solvent of the photoresist film is highly desirable. A PAB process may include baking the desired substrate (e.g., wafer), at a temperature of about 80° C. to about 120° C. for a period of about 10 seconds to about 120 seconds. A preferred PAB is at 110° C. for 60 seconds.

Additionally, it may be desirable to include a post-exposure bake (PEB) in a manner consistent with the PAB methodology described above. Although it is not necessary for performance of many low activation energy chemically amplified photoresists, a PEB may be included to enhance lithographic imaging quality. A PEB process may include baking the wafer or substrate at a temperature of about 80° C. to about 120° C. for a period of about 10 seconds to about 120 seconds. A preferred PEB is at 110° C. for 60 seconds. It is to be appreciated that both PAB and PEB processes may be accomplished using conventional methods understood by those skilled in the art, such as, for example, contact hot plate baking, oven baking, proximity baking, etc. It may also be desirable to incorporate prior treatment of the substrate with a surface priming agent including, but not limited to, conventional silylating agents such as, for example, hexamethyldisilazane and/or related species by techniques known to those skilled in the art. Illustrative techniques suitable for use with the present invention include, without limitation, vapor priming and liquid puddle application.

The method can further include etching the patterned substrate using a conventional etching process that may include, but is not limited to, a reactive ion etch. In addition any remaining photoresist composition can be removed from the substrate, for example, using a stripping agent.

Although illustrative embodiments of the present invention have been described herein, it is to be understood that the invention is not limited to those precise embodiments, and that various other changes and modifications may be effected therein by one skilled in the art without departing from the scope or spirit of the invention. The following examples are provided to illustrate the scope and spirit of the present invention. Because these examples are given for illustrative purposes only, the invention embodied therein should not be limited thereto.

EXAMPLES

Example 1

Synthesis of 1,1,1-trifluoro-2-trifluoromethyl-2-hydroxy-5-pentyl Methacrylate and 1,1,1-trifluoro-2-trifluoromethyl-2-hydroxy-4-pentyl Methacrylate (II and III)

Preparation of 1,1,1-trifluoro-2-trifluoromethyl-2,5-pentanediol and 1,1,1-trifluoro-2-trifluoromethyl-2,4-pentanediol To a 3-necked, 3-L round bottomed flask equipped with an overhead stirrer, digital thermometer and a 1-L constant-pressure addition funnel with a nitrogen inlet was added 974 mL (1.95 mol) of borane-dimethylsulfide complex (2.0M in THF). The addition funnel was charged with a solution of 353 g (1.7 mol) of 1,1,1-trifluoro-2-trifluoromethyl-4-penten-2-ol in 400 mL of anhydrous THF. The flask was cooled and the olefin was added slowly with stirring while maintaining a temperature below 15° C. The mixture was stirred at room temperature for two days after which time it was recooled and 750 mL (2.25 mol) of 3M NaOH(aq) was added carefully. The reaction mixture was reduced in volume on a rotary evaporator and subsequently co-evaporated with two 500 mL portions of diethylether. The resulting heavy oil was taken up in 300 mL of THF and the solution transferred to a 1-L 3-necked round-bottomed flask equipped with a 250-mL addition funnel, a digital thermometer and a magnetic stir bar. The addition funnel was charged with 250 mL of 30% hydrogen peroxide. The flask was cooled and the hydrogen peroxide added slowly with stirring. After stirring overnight at room temperature, the solution was diluted with 1 L of diethylether and adjusted to pH 6 (wet litmus) with 5% HCl. The ether layer was separated and the aqueous layer was extracted with 2×500 mL of ether. The combined organic phases were washed with 2×500 mL of saturated ammonium chloride and brine, dried over $MgSO_4$ and evaporated to a crude yield of 379 g of a 45:55 (2°:1°) mixture of the two title alcohols. The diols were separated by distillation through a 12" Vigreux, bp 47° C. at 1.0 mm Hg (2° alcohol) and bp 55° C. at 1.0 mm Hg (1° alcohol). The 1° alcohol is a viscous oil while the 2° alcohol is a low melting solid.

Preparation of 1,1,1-trifluoro-2-trifluoromethyl-2-hydroxy-5-pentyl Methacrylate (II)

To a 3-necked, 2-L round-bottomed flask equipped with an overhead stirrer, digital thermometer and a 1-L constant-pressure addition funnel with a nitrogen inlet was added 590 mL (0.944 mol) of n-butyllithium (1.6M in hexane). The addition funnel was charged with a solution of 107 g (0.47 mol) of 1,1,1-trifluoro-2-trifluoromethyl-2,5-pentanediol in 300 mL of anhydrous THF. The flask was cooled and the diol was added dropwise with stirring while maintaining a temperature below 15° C. The resulting yellow-orange solution was stirred for an additional 2 hours at which time a solution of 54.5 g (0.52 mol) of methacryloyl chloride in 200 mL of anhydrous THF was added dropwise over 1 h at 10° C. The reaction mixture was allowed to reach room temperature overnight after which it was diluted with 500 mL of diethylether and washed with 2×500 mL of saturated ammonium chloride and brine, dried over $MgSO_4$, evaporated and distilled at 74° C. at 1.0 mm Hg (0.5 g of phenothiazine was added to the pot prior to distillation) to yield 109 g (79%) of the title compound.

Preparation of 1,1,1-trifluoro-2-trifluoromethyl-2-hydroxy-4-pentyl Methacrylate (III)

The title compound was prepared in the same fashion as the above described methacrylate using 142 g (0.63 mol) of 1,1,1-trifluoro-2-trifluoromethyl-2,4-pentanediol, 793 mL (1.27 mol) of n-butyllithium (1.6M in hexane) and 73 g (0.69 mol) of methacryloyl chloride to yield, after distillation at 67° C. at 1.0 mm Hg, 142 g (76%) of the 2° methacrylate as a clear, colorless oil.

Example 2

Synthesis of 2-{[5-(1',1',1'-trifluoro-2'-trifluoromethyl-2'-hydroxy)propyl]norbornyl} methacrylate (IV)

Preparation of 2-hydroxy-5-[(1',1',1'-trifluoro-2'-trifluoromethyl-2'-hydroxy)propyl] Norbornane To a 3-necked, 500-mL round bottomed flask equipped with a condenser (nitrogen inlet), digital thermometer and magnetic stir bar was added 173.2 g (0.63 mol) of 5-[(1',1',1'-trifluoro-2'-trifluoromethyl-2'-hydroxy)propyl]-2-norbornene and 100 g (1.9 mol) of formic acid (88%) and the mixture heated at 100° C. under nitrogen overnight. The resulting yellow solution was evaporated on a rotary evaporator leaving a thick yellow oil to which was added 120 mL of concentrated ammonium hydroxide (28%) and the mixture heated with stirring at 60° C. overnight. After cooling, the layers were separated and the lower layer was diluted with 500 mL of diethylether and washed sequentially with 5% (v/v) HCl (2×250 mL), water (2×200 mL) and brine. The ether solution was dried over $MgSO_4$, evaporated and distilled at 92° C. at 0.8 mm Hg to yield 156 g (84%) of the title compound as a clear, colorless oil.

Preparation of 2-{[5-(1',1',1'-trifluoro-2'-trifluoromethyl-2'-hydroxy)propyl]norbornylate} Methacrylate (IV)

To a three-necked, 3-L round-bottomed flask equipped with an overhead stirrer, a digital thermometer and a 1-L constant-pressure addition funnel with a nitrogen inlet was added 147.0 g (0.5 mol) of 2-hydroxy-5-[(1',1',1'-trifluoro-2'-trifluoromethyl-2'-hydroxy)propyl]norbornane and 1000 mL of anhydrous THF. The addition funnel was charged with 660 mL (1.05 mol) of a 1.6M solution of n-butyllithium in hexane. The flask was cooled to 5° C. and the butyllithium solution was added slowly dropwise with stirring while maintaining a temperature of less than 15° C. The resulting suspension was allowed to reach room temperature for about 6 hours at which time it was recooled to 5° C. and a solution of 57.8 g (0.55 mol) of methacryloyl chloride in 200 mL of anhydrous THF was slowly added dropwise while maintaining a temperature of less than 10° C. The mixture rapidly became homogeneous and was allowed to reach room temperature with stirring overnight. Dilute HCl (5% v/v) was then added to an apparent pH of 5–6 by wet litmus and the mixture reduced in volume on a rotary evaporator followed by dilution with 2 L of diethylether. The ether solution was washed with water and brine, dried over $MgSO_4$, evaporated and distilled at 120° C. at 0.6 mm Hg (approximately 1.0 g of phenothiazine was added to the pot prior to distillation) to yield 130 g (72%) of the title compound as a clear, colorless oil.

Alternative Preparation of 2-{[5-(1',1', 1'-trifluoro-2'-trifluoromethyl-2'-hydroxy)propyl]norbornyl} Methacrylate (IV)

3-(5-Bicyclo-[2,2,1]heptene-2-yl)-1,1,1-trifluoro-2-(trifluoromethyl)-2-propanol (NBHFA) (54.8 g, 0.20 mole), methacrylic acid (51.65 g, 0.60 mole) and 50 mL ether were placed in a round bottom flask equipped with a condenser, magnetic stirrer and a nitrogen inlet. While stirring, concentrated sulfuric acid 98% (6.08 g, 3.25 mL, 0.06 mole) was added dropwise at room temperature via a graduated pipette. A mildly exothermic reaction occurred. The mixture was heated to reflux for 18 hours. Afterwards, the mixture was diluted with 50 mL tetrahydrofuran (THF) and poured cautiously into a sodium bicarbonate solution (50 grams, 0.60 mole in 600 mL DI water) and stirred for 2 hours. The mixture was then extracted with 2×150 mL ether. Combined organic extracts were washed with 150 mL saturated sodium bicarbonate solution followed by 150 mL brine and dried over anhydrous magnesium sulfate. The solution was concentrated in vacuo. Fractional distillation under reduced pressure gave 32.44 grams of the desired product at 140° C. at 2 mm.

Second Alternative Preparation of 2-{[5-(1',1,1'-trifluoro-2'-trifluoromethyl-2'-hydroxy)propyl]norbornyl} Methacrylate (IV)

3-(5-Bicyclo-[2,2,1]heptene-2-yl)-1,1,1-trifluoro-2-(trifluoromethyl)-2-propanol (NBHFA) (4.0 g, 14.6 mmol), methacrylic acid (1.26 g, 14.6 mmol) and t-butylcatechol (25 mg) were dissolved in 20 mL of methylethyl ketone (MEK). Phosphotungstic acid ($H_3PW_{12}O_{40}$) (0.42 g, 0.146 mmol) was added and the solution was heated to 60° C. for 3 hr. After cooling to room temperature, the solution was diluted with 50 mL of diethyl ether, then sequentially washed with three 20 mL portions each of 10% (w/v) aqueous sodium bicarbonate and brine. The organic solution was dried over anhydrous sodium sulfate and filtered. The solution was then stirred with activated carbon for 5 min. at room temperature and filtered over Celite filter-aid. After rotary evaporation to remove solvent, the desired compound was vacuum distilled (115–119° C. at 750 mTorr) from the resulting yellow oil to provide a colorless liquid (3.58 g, 68%).

Example 3

Synthesis of 6-methacryloxymethyl-2-naphthol (XIII)

Preparation of Methyl 6-hydroxy-2-naphthoate

To a 1-L round bottomed flash equipped with a nitrogen inlet and magnetic stir bar was added 50 g (0.27 mol) of 6-hydroxy-2-naphthoic acid and 400 mL of methanol. The suspension was treated slowly with 1 mL of con. $H_2SO_4$ and stirred at room temperature overnight. The resulting solution was evaporated, taken up in 500 mL of ethyl acetate and washed sequentially with 3×300 ML of saturated $NaHCO_3$, 2×300 mL of water and brine. The pale yellow solution was dried over $MgSO_4$, reduced in volume to about 100 mL and slowly treated with hexane. The resulting crystalline precipitate was collected and dried under a stream of nitrogen to yield 52 g (95%) of the title compound as fine, white plates, mp 196° C.

Preparation of 6-hydroxymethyl-2-naphthol

To a 3-necked, 1-L round bottomed flask equipped with an overhead stirrer, digital thermometer and 500-mL constant-pressure addition funnel with a nitrogen inlet was added 11 g (0.29 mol) of lithium aluminum hydride and 200 mL of anhydrous THF. The addition funnel was charged with a solution of 40 g (0.2 mol) of methyl 6-hydroxy-2-naphthoate. The flask was cooled in ice/water and the naphthoate slowly added over 1 hour. The suspension was stirred overnight, recooled and cautiously treated with 100 mL of water. The white suspension was poured into 5% (v/v) HCl and extracted several times with ethyl acetate. The combined extracts were washed with water, dried, evaporated and the residue recrystallized in hexane/ethyl acetate to yield a total of 30 g (87%) of the title compound in three crops as beige plates, mp 179–181° C.

Synthesis of 6-methacryloxymethyl-2-naphthol (XIII)

To a 3-necked, 500-mL round bottomed flask equipped with an overhead stirrer, a digital thermometer and a 250-mL constant-pressure addition funnel with a nitrogen inlet was added 25 g (0.14 mol) of 6-hydroxymethyl-2-naphthol and 100 mL of anhydrous THF. The addition funnel was charged with 190 mL (0.3 mol) of n-butyllithium (1.6M in hexane). The flask was cooled to 5° C. and the butyllithium was added slowly while maintaining a temperature of less than 15° C. The resulting suspension was stirred for 1 h at which time a solution of 14.9 g (0.15 mol) of methacryloyl chloride in 100 mL of anhydrous THF was slowly added while maintaining a temperature of less than 10° C. Stirring was continued with cooling for 6 h at which time the reaction mixture was poured into 300 mL of saturated ammonium chloride with vigorous stirring. The organic layer was separated and the aqueous layer extracted with ethyl acetate. The combined organic phases were washed with water and brine, dried and evaporated. The resulting residue was chromatographed on silica gel with 35% ethyl acetate in hexane. The fractions containing the pure product were combined and evaporated to yield 19 g (56%) of the title compound as an off-white solid.

Example 4

Synthesis of 2-methacryloxy-6-hydroxymethylnaphthalene (XII)

To a 3-necked, 500-mL round bottomed flask equipped with a digital thermometer, 50-mL constant-pressure addition funnel with a nitrogen inlet and a magnetic stir bar was added 25 g (0.14 mol) of 6-hydroxymethyl-2-naphthol, 200 mL of dichloromethane and 14.5 g (0.14 mol) of triethylamine. The addition funnel was charged with a solution of 14.9 g (0.15 mol) of methacryloyl chloride in 30 mL of dichloromethane. The flask was cooled to 5° C. and the acid chloride added slowly dropwise while maintaining a temperature of less than 10° C. The reaction mixture was stirred at room temperature overnight after which it was washed with water and brine, dried over $MgSO_4$, evaporated and the residue chromatographed on silica gel with 35% ethyl acetate in hexane. The fractions containing the pure product were combined and evaporated to yield 22 g (65%) of the title compound as an off-white solid. Approximately 8 g of starting material can be recovered from the column by increasing the percentage of ethyl acetate in the mobile phase.

Example 5

Synthesis of 3-Furfuryloxy-2-hydroxyprop-1-yl Methacrylate (VIII)

A mixture of methacrylic acid (10 g), furfuryl glycidyl ether (15 g) and triethylamine (0.3 g) was heated to 100° C. for 2 hours then to 105° C. for an additional 2 hours. GC analysis showed 96% conversion. The mixture was taken up into ether, washed with water, followed by saturated sodium bicarbonate, dried with $MgSO_4$ filtered and rotary evaporated to provide 23.7 g of a faintly yellow oil (94.8%).

Example 6

Synthesis of a Polymer for 193 nm Positive Tone Photoresist: Poly(IV-co-II-co-XXI)

2-{[5-(1',1',1'-Trifluoro-2'-trifluoromethyl-2'-hydroxy) propyl]norbornyl} methacrylate (IV) (5.04 g, 0.014 mol), 1,1,1-trifluoro-2-trifluoromethyl-2-hydroxy-5-pentyl methacrylate (II) (2.06 g 0.007 mol), 2-methyladamantyl methacrylate (XXI) (3.51 grams, 0.014 mole) and 32 g of tetrahydrofuran (THF) were placed in a round bottom flask equipped with a condenser and a nitrogen inlet. 2,2'-Azobisisobutyronitrile (AIBN) (0.23 g, 0.0014 mol) was added to this solution and stirred until dissolved. Then, the solution was degassed using four vacuum/nitrogen purges. The contents were then heated to reflux for 18 hours. Afterwards, the solution was added dropwise into hexanes (700 mL). The precipitated polymer was filtered, washed twice with hexanes (50 mL) and dried under vacuum at 60° C.

Example 7

Synthesis of a Polymer for 193 nm Negative Tone Photoresists: Poly(II-co-XIII)

1,1,1-Trifluoro-2-trifluoromethyl-2-hydroxy-5-pentyl methacrylate (II) (5.30 g 0.018 mol), 2-methacryloxy-6-hydroxymethylnaphthalene (XII) (0.49 g, 0.002 mol) and 18 grams of THF were placed in a round bottom flask equipped with a condenser and a nitrogen inlet. AIBN (0.13 g, 0.8 mmol) was added to this solution and stirred until dissolved. Then, the solution was degassed using four vacuum/nitrogen purges. The contents were then heated to reflux for 18 hours. Afterwards, the solution was added dropwise into hexanes (500 mL). The precipitated polymer was filtered, washed twice with hexanes (50 mL) and dried under vacuum at 60° C.

Example 8

Synthesis of a Polymer for 193 nm Negative Tone Photoresists: Poly(III-co-XII)

1,1,1-Trifluoro-2-trifluoromethyl-2-hydroxy-4-pentyl methacrylate (5.30 grams 0.018 mole) and 2-methacryloxy-6-hydroxymethylnaphthalene (XII) (0.49 grams, 0.002 mole) were placed with 18 g of THF in a round bottom flask equipped with a condenser and a nitrogen inlet. AIBN (0.13 g, 0.80 mmol) was added to this solution and stirred until dissolved. Then, the solution was degassed using four vacuum/nitrogen purges. The contents were then heated to reflux for 18 hours. Afterwards, the solution was added dropwise into hexanes (500 mL). The precipitated polymer was filtered (frit), washed twice with hexanes (50 mL) and dried under vacuum at 60° C.

Example 9

Synthesis of a Polymer for 193 nm Negative Tone Photoresists: Poly(III-co-IV-co-XIV)

1,1,1-Trifluoro-2-trifluoromethyl-2-hydroxy-4-pentyl methacrylate (III) (2.53 g, 8.61 mmol), 2-{[5-(1',1',1'-trifluoro-2'-trifluoromethyl-2'-hydroxy)propyl]norbornyl]} methacrylate (IV) (1.55 g, 4.31 mmol) and 2-hydroxyethyl methacrylate (XIV) (0.187 g, 1.44 mmol) were dissolved in isopropyl alcohol (10 g, 30 wt-% solution) with AIBN (23.5 mg, 0.144 mmol). The solution was deoxygenated by bubbling dry N2 for several minutes and then allowed to reflux for 16 hr. The reaction mixture was cooled to room temperature and precipitated in 400 mL of hexanes with rigorous stirring. The resulting white solid was collected by filtration, washed with several small portions of hexanes and dried under vacuum at 60° C. for 20 hr.

Example 10

Synthesis of a Polymer for 193 nm Negative Tone Photoresists: Poly(II-co-III-co-XIV)

The same procedure was used as set forth in Example 9 using the monomers: 1,1,1-trifluoro-2-trifluoromethyl-2-hydroxy-5-pentyl methacrylate (II) (3.00 g, 10.2 mmol), 1,1,1-trifluoro-2-trifluoromethyl-2-hydroxy-4-pentyl methacrylate (III) (1.05 g, 2.92 mmol) and 2-hydroxyethyl methacrylate (XIV) (0.190 g, 1.46 mmol) and AIBN (10.0 mg, 0.0580 mmol).

Example 11

Synthesis of a Polymer for 193 nm Negative Tone Photoresists: Poly(II-co-XIV)

The same procedure was used as set forth in Example 9 using the monomers: 1,1,1-trifluoro-2-trifluoromethyl-2-hydroxy-5-pentyl methacrylate (II) (3.00 g, 10.2 mmol) and 2-hydroxyethyl methacrylate (XIV) (0.330 g, 2.56 mmol) and AIBN (8.00 mg, 0.0510 mmol).

Example 12

Synthesis of a Polymer for 193 nm Negative Tone Photoresists: Poly(III-co-XIV)

The same procedure was used as set forth in Example 9 using the monomers: 1,1,1-trifluoro-2-trifluoromethyl-2-hydroxy-4-pentyl methacrylate (III) (3.00 g, 10.2 mmol) and 2-hydroxyethyl methacrylate (XIV) (0.330 g, 2.56 mmol) and AIBN (8.00 mg, 0.0510 mmol).

Example 13

Synthesis of a Polymer for 193 nm Negative Tone Photoresists: Poly(IV)

The same procedure was used as set forth in Example 9 using the monomer: 2-{[5-(1',1',1'-trifluoro-2'-trifluoromethyl-2'-hydroxy)propyl]norbornyl]} methacrylate (IV) (5.00 g, 13.9 mmol) and AIBN (9.00 mg, 0.0556 mmol).

Example 14

Synthesis of a Polymer for 193 nm Negative Tone Photoresists: Poly(III-co-IV-co-IX-co-XIV)

The same procedure was used as set forth in Example 9 using the monomers: 1,1,1-trifluoro-2-trifluoromethyl-2-hydroxy-5-pentyl methacrylate (III) (1.75 g, 5.95 mmol), 2-{[5-(1',1',1'-trifluoro-2'-trifluoromethyl-2'-hydroxy)propyl]norbornyl]} methacrylate (IV) (0.857 g, 2.38 mmol), tetracyclo[5.2.1.0$^{2,7}$.0$^{4,6}$]-5-oxo-undecanyl-10-methacrylate (IX) (0.557 g, 2.38 mmol) and 2-hydroxyethyl methacrylate (XIV) (0.155 g, 1.19 mmol) and AIBN (3.00 mg, 0.0480 mmol).

Example 15

Synthesis of a Polymer for 193 nm Negative Tone Photoresists: Poly(III)

The same procedure was used as set forth in Example 9 using the monomer: 1,1,1-trifluoro-2-trifluoromethyl-2-hydroxy-4-pentyl methacrylate (III) (2.00 g, 6.80 mmol) and AIBN (22.3 mg, 0.136 mmol).

Example 16

Synthesis of a Polymer for 193 nm Negative Tone Photoresists: Poly(III-co-XVI)

The same procedure was used as set forth in Example 9 using the monomers: 1,1,1-trifluoro-2-trifluoromethyl-2-hydroxy-4-pentyl methacrylate (III) (3.00 g, 10.2 mmol) and 4-hydroxy-2-adamantyl methacrylate (XVI) (0.566 g, 2.55 mmol) and AIBN (41.8 mg, 0.255 mmol).

Example 17

Synthesis of a Polymer for 193 nm Negative Tone Photoresists: Poly(III-co-XVI-co-XIV)

The same procedure was used as above with the monomers: 1,1,1-trifluoro-2-trifluoromethyl-2-hydroxy-4-pentyl methacrylate (III) (3.00 g, 10.2 mmol), 4-hydroxy-2-adamantyl methacrylate (XVI) (1.13 g, 5.10 mmol) and 2-hydroxyethyl methacrylate (XIV) (0.221 g, 1.70 mmol) and AIBN (18.6 mg, 0.113 mmol).

Example 18

Synthesis of a Polymer for 193 nm Positive Tone Photoresist: Poly(IV-co-XXI)

2-{[5-(1', 1',1'-Trifluoro-2'-trifluoromethyl-2'-hydroxy)propyl]norbornyl]} methacrylate (IV) (18.05 g, 0.05 mol), 2-methyl-2-adamantyl methacrylate (XXI) (8.40 g, 0.033 mol) and 79 g THF were placed in a round bottom flask equipped with a condenser and a nitrogen inlet. AIBN (0.55 grams, 3.30 mmol) was added to this solution and stirred until dissolved. Then, the solution was degassed using four vacuum/nitrogen purges. The contents were then heated to reflux for 18 hr. Afterwards, the solution was added drop wise into hexanes (1.6 L). The precipitated polymer was filtered, washed twice with hexanes (100 mL) and dried under vacuum at 60° C.

Example 19

Synthesis of a Polymer for 193 nm Positive Tone Photoresist: Poly(IV-co-XX)

The same procedure was used as set forth in Example 18 using the monomers: 2-{[5-(1',1',1'-trifluoro-2'-trifluoromethyl-2'-hydroxy)propyl]norbornyl]} methacrylate (IV) (8.70 g, 0.024 mol) and 1-methyl-1-cyclopentyl methacrylate (XX) (2.70 g, 0.016 mol) and AIBN ((0.27 g, 1.60 mmol).

Example 20

Synthesis of a Polymer for 193 nm Positive Tone Photoresist: Poly(IV-co-XXI-co-XXIII)

The same procedure was used as set forth in Example 18 using the monomers: 2-{[5-(1',1',1'-trifluoro-2'-trifluoromethyl-2'-hydroxy)propyl]norbornyl]} methacrylate (IV) (5.40 g, 0.015 mol), 2-methyl-2-adamantyl methacrylate (XXI) (2.26 g, 0.009 mol) and 5-methacryloyloxy-2,6-norbornanecarbolactone (XXIII) (1.33 g, 0.006 mol) and AIBN (0.20 g, 1.20 mmol).

Example 21

Synthesis of a Polymer for 193 nm Negative Tone Photoresists: Poly(III-co-IV-co-MV-co-methacrylic acid)

The same procedure was used as set forth in Example 9 using the monomers: 1,1,1-trifluoro-2-trifluoromethyl-2-hydroxy-4-pentyl methacrylate (III) (1.31 g, 4.47 mmol), 2-{[5-(1',1', 1'-trifluoro-2'-trifluoromethyl-2'-hydroxy)propyl]norbornyl]} methacrylate (IV) (0.495 g, 1.38 mmol), 2-hydroxyethyl methacrylate (XIV) (0.0894 g, 0.688 mmol) and methacrylic acid (0.0296 g, 0.344 mmol) and AIBN (11.3 mg, 0.0688 mmol)

Example 22

Synthesis of a Polymer for 193 nm Negative Tone Photoresists: Poly(II-co-VII)

The same procedure was used as set forth in Example 9 using the monomers: 1,1-1,1,1-trifluoro-2-trifluoromethyl-2-hydroxy-5-pentyl methacrylate (II) (4.0 g) and tetrahydrofurfurylmethacrylate (VII) (1.55 g) and AIBN (0.18 g), with the exception of using ethyl acetate as the solvent.

Example 23

Synthesis of a Polymer for 193 nm Negative Tone Photoresists: Poly(II-co-VI)

The same procedure was used as set forth in Example 22 using the monomers: 1,1-1,1,1-trifluoro-2-trifluoromethyl-2-hydroxy-5-pentyl methacrylate (II) (4.0 g) and furfurylmethacrylate (VI) (1.00 g) and AIBN (0.18 g).

Example 24

Synthesis of a Polymer for 193 nm Negative Tone Photoresists: Poly(II-co-VIII)

The same procedure was used as set forth in Example 22 using the monomers: 1,1-1,1,1-trifluoro-2-trifluoromethyl-2-hydroxy-5-pentyl methacrylate (II) (4.0 g) and 3-furfuryloxy-2-hydroxyprop-1-yl methacrylate (VIII) (1.30 g) and AIBN (0.18 g).

What is claimed is:

1. A photoresist composition comprising a polymer, said polymer comprising at least one acrylate or methacrylate monomer having a formula:

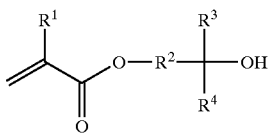

I where $R^1$ represents hydrogen (H), a linear or branched alkyl group of 1 to 20 carbons, or a semi- or perfluorinated linear or branched alkyl group of 1 to 20 carbons; and where $R^2$ represents an unsubstituted aliphatic group or a substituted aliphatic group having zero or one trifluoromethyl ($CF_3$) group attached to each carbon of the substituted aliphatic group, or a substituted or unsubstituted aromatic group; and where $R^3$ represents hydrogen (H), methyl ($CH_3$), trifluoromethyl ($CF_3$), difluoromethyl ($CHF_2$), fluoromethyl ($CH_2F$), or a semi- or perfluorinated aliphatic group; and where $R^4$ represents trifluoromethyl ($CF_3$), difluoromethyl ($CHF_2$), fluoromethyl ($CH_2F$), or a semi- or perfluorinated substituted or unsubstituted aliphatic group.

2. The composition of claim 1, further comprising at least one of a solvent, photoacid generator, crosslinking agent, basic compound, surfactant, latent basic compound, photobase generator, dissolution inhibitor, dissolution accelerator, adhesion promoter, and defoaming agent.

3. The composition of claim 1, wherein $R^1$ represents hydrogen, methyl, or trifluoromethyl.

4. The composition of claim 1, wherein a methylene group of said monomer is substituted with at least one halogen atom.

5. The composition of claim 1, wherein said monomer is selected from the group consisting of 1,1,1-trifluoro-2-trifluoromethyl-2-hydroxy-5-pentyl methacrylate, or its analogous acrylate; 1,1,1-trifluoro-2-trifluoromethyl-2-hydroxy-4-pentyl methacrylate, or its analogous acrylate; and 2-{[5-(1',1',1'-trifluoro-2'-trifluoromethyl-2'-hydroxy)propyl]norbornyl]}methacrylate or its analogous acrylate.

6. The composition of claim 1, wherein said composition is a negative tone photoresist.

7. The composition of claim 1, wherein said composition further comprises a crosslinking agent.

8. The composition of claim 7, wherein said crosslinking agent is added during formulation of said composition.

9. The composition of claim 7, wherein said crosslinking agent comprises at least one of a glycouril, melamine, epoxide, furyl, tetrahydrofuryl, and vinyl ether.

10. The composition of claim 9, wherein said glycouril is represented by a formula:

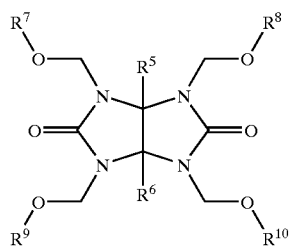

V wherein $R^5$, $R^6$, $R^7$, $R^8$, $R^9$ and $R^{10}$ each represent hydrogen or an aliphatic group or an aromatic group.

11. The composition of claim 1, wherein said composition is a positive tone photoresist.

12. The composition of claim 1, wherein a hydrogen of at least one fluoro alcohol group of said monomer is substituted with an acid labile group.

13. The composition of claim 12, wherein said acid labile group comprises at least one of t-alkyl carbonate, t-alkyl ester, t-alkyl ether, ketal, and acetal.

14. The composition of claim 1, wherein said composition further comprises at least one co-monomer.

15. The composition of claim 14, wherein said co-monomer comprises a nucleophile.

16. The composition of claim 15, wherein said nucleophile is an alcohol.

17. The composition of claim 14, wherein said composition further comprises a crosslinking agent.

18. The composition of claim 17, wherein said crosslinking agent is attached to said polymer.

19. The composition of claim 17, wherein said crosslinking agent comprises at least one of a glycouril, melamine, epoxide, furyl, tetrahydrofuryl, and vinyl ether.

20. The composition of claim 14, wherein said at least one co-monomer is selected from the group consisting of 2-methacryloxy-6-hydroxymethylnaphthalene, 6-methacryloxymethyl-2-naphthol, 2-hydroxyethylmethacrylate, 3-hydroxy-1-adamantylmethacrylate, 3-hydroxy-1-adamantylacrylate, 2-methacryloxy-5-hydroxymethylnorbornane, 2-acryloxy-5-hydroxymethylnorbornane, or a combination thereof.

21. The composition of claim 14, wherein said composition is a negative tone photoresist.

22. The composition of claim 14, wherein said composition is a negative tone photoresist, and wherein said at least one co-monomer comprises a crosslinking group.

23. The composition of claim 22, wherein said at least one co-monomer is selected from the group consisting of furfurylmethacrylate, tetrahydrofurfurylmethacrylate, 3-furfuryloxy-2-hydroxyprop-1-yl methacrylate, tetracyclo[5.2.1.0$^{2,7}$.0$^{4,6}$]-5-oxo-undecanyl-10-methacrylate, tetracyclo[5.2.1.0$^{2,7}$.0$^{4,6}$]-5-oxo-undecanyl-10-acrylate, glycidylmethacrylate, 2-methacryloxy-6-hydroxymethylnaphthalene, or a combination thereof.

24. The composition of claim 14, wherein said composition is a positive tone photoresist, and wherein said at least one co-monomer comprises an acid labile moiety.

25. The composition of claim 24, wherein said at least one co-monomer is selected from the group consisting of t-butylmethacrylate, 1-methyl-cyclopentylmethacrylate, 2-methyl-2-adamantylmethacrylate, or a combination thereof.

26. The composition of claim 14, wherein said at least one co-monomer comprises at least one polar group selected from the group consisting of lactone, sulfonamide, anhydride, carboxylic acid, or a combination thereof.

27. The composition of claim 26, wherein said co-monomer comprises at least one of α-methacryloyloxy-γ-butyrolactone and 5-methacryloyloxy-2,6-norbornanecarbolactone.

28. The composition of claim 26, wherein said co-monomer acts to accelerate dissolution of photoresist composition unexposed to a radiation source.

29. The composition of claim 28, wherein said co-monomer comprises a carboxylic acid.

30. The composition of claim 29, wherein said co-monomer comprises at least one of an acrylic acid and methacrylic acid.

31. A method of patterning a substrate, said method comprising applying a photoresist composition to the substrate, the photoresist composition comprising a polymer, said polymer said polymer comprising at least one acrylate or methacrylate monomer having a formula:

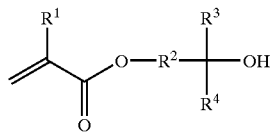

I where $R^1$ represents hydrogen (H), a linear or branched alkyl group of 1 to 20 carbons, or a semi- or perfluorinated linear or branched alkyl group of 1 to 20 carbons; and where $R^2$ represents an unsubstituted aliphatic group or a substituted aliphatic group having zero or one trifluoromethyl ($CF_3$) group attached to each carbon of the substituted aliphatic group, or a substituted or unsubstituted aromatic group; and where $R^3$ represents hydrogen (H), methyl ($CH_3$), trifluoromethyl ($CF_3$), difluoromethyl ($CHF_2$), fluoromethyl ($CH_2F$), or a semi- or perfluorinated aliphatic group; and where $R^4$ represents trifluoromethyl ($CF_3$), difluoromethyl ($CHF_2$), fluoromethyl ($CH_2F$), or a semi- or perfluorinated substituted or unsubstituted aliphatic group, thereby forming a film;

patternwise exposing the film to an imaging radiation source; and developing areas of the film to form a patterned substrate.

32. The method of claim 31, further comprising baking the film after applying the photoresist composition and before exposing the film.

33. The method of claim 31, further comprising baking the film after exposing and before developing the film.

34. The method of claim 31, further comprising etching the patterned substrate.

35. The method of claim 34, wherein said etching comprises ion etching.

36. The method of claim 31, wherein said film is insoluble, and wherein said developing step renders said film soluble where exposed to the imaging radiation source.

37. The method of claim 36, further comprising removing said soluble film.

38. The method of claim 31, wherein said film is soluble, and wherein said developing step renders said film insoluble where exposed to the imaging radiation source.

39. The method of claim 38, further comprising the step of removing said soluble film.

40. The method of claim 31, wherein said composition further comprises at least one of a solvent, photoacid generator, crosslinking agent, basic compound, surfactant, latent basic compound, photobase generator, dissolution inhibitor, dissolution accelerator, adhesion promoter, and defoaming agent.

41. The method of claim 31, wherein $R^1$ represents hydrogen, methyl, or trifluoromethyl.

42. The method of claim 31, wherein a methylene group of said monomer is substituted with at least one halogen atom.

43. The method of claim 31, wherein said monomer is selected from the group consisting of 1,1,1-trifluoro-2-trifluoromethyl-2-hydroxy-5-pentyl methacrylate, or its analogous acrylate; 1,1,1-trifluoro-2-trifluoromethyl-2-hydroxy-4-pentyl methacrylate, or its analogous acrylate; and 2-{[5-(1',1',1'-trifluoro-2'-trifluoromethyl-2'-hydroxy)propyl]norbornyl]}methacrylate, or its analogous acrylate.

44. The method of claim 31, wherein said composition is a negative tone photoresist.

45. The method of claim 31, wherein said composition further comprises a crosslinking agent.

46. The method of claim 45, wherein said crosslinking agent is added during formulation of said composition.

47. The method of claim 45, wherein said crosslinking agent comprises at least one of a glycouril, melamine, epoxide, furyl, tetrahydrofuryl, and vinyl ether.

48. The method of claim 47, wherein said glycouril is represented by a formula:

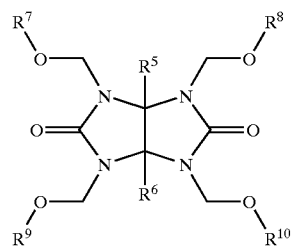

V wherein $R^5$, $R^6$, $R^7$, $R^8$, $R^9$ and $R^{10}$ each represent hydrogen or an aliphatic group or an aromatic group.

49. The method of claim 31, wherein said composition is a positive tone photoresist.

50. The method of claim 31, wherein a hydrogen of at least one fluoro alcohol group of said monomer is substituted with an acid labile group.

51. The method of claim 50, wherein said acid labile group comprises at least one of t-alkyl carbonate, t-alkyl ester, t-alkyl ether, ketal, and acetal.

52. The method of claim 31, wherein said composition further comprises at least one co-monomer.

53. The method of claim 52, wherein said co-monomer comprises a nucleophile.

54. The method of claim 53, wherein said nucleophile is an alcohol.

55. The method of claim 52, wherein said composition further comprises a crosslinking agent.

56. The method of claim 55, wherein said crosslinking agent is attached to said polymer.

57. The method of claim 55, wherein said crosslinking agent comprises at least one of a glycouril, melamine, epoxide, furyl, tetrahydrofuryl, and vinyl ether.

58. The method of claim 52, wherein said at least one co-monomer is selected from the group consisting of 2-methacryloxy-6-hydroxymethylnaphthalene, 6-methacryloxymethyl-2-naphthol, 2-hydroxyethylmethacrylate, 3-hydroxy-1-adamantylmethacrylate, 3-hydroxy-1-adamantylacrylate, 2-methacryloxy-5-hydroxymethylnorbornane, 2-acryloxy-5-hydroxymethylnorbornane, or a combination thereof.

59. The method of claim 52, wherein said composition is a negative tone photoresist.

60. The method of claim 52, wherein said composition is a negative tone photoresist, and wherein said at least one co-monomer comprises a crosslinking group.

61. The method of claim 60, wherein said at least one co-monomer is selected from the group consisting of furfurylmethacrylate, tetrahydrofurfurylmethacrylate, 3-furfuryloxy-2-hydroxyprop-1-yl methacrylate, tetracyclo [$5.2.1.0^{2,7}.0^{4,6}$]-5-oxo-undecanyl-10-methacrylate, tetracyclo[$5.2.1.0^{2,7}.0^{4,6}$]-5-oxo-undecanyl-10-acrylate, glycidylmethacrylate, or 2-methacryloxy-6-hydroxymethylnaphthalene, or a combination thereof.

62. The method of claim 52, wherein said composition is a positive tone photoresist, and wherein said at least one co-monomer comprises an acid labile moiety.

63. The method of claim 62, wherein said at least one co-monomer is selected from the group consisting of t-butylmethacrylate, 1-methyl-cyclopentylmethacrylate, 2-methyl-2-adamantylmethacrylate, or a combination thereof.

64. The method of claim 52, wherein said at least one co-monomer comprises at least one polar group selected from the group consisting of lactone, sulfonamide, anhydride, carboxylic acid, or a combination thereof.

65. The method of claim 64, wherein said co-monomer comprises at least one of $\alpha$-methacryloyloxy-$\gamma$-butyrolactone, and 5-methacryloyloxy-2,6-norbornanecarbolactone.

66. The method of claim 64, wherein said co-monomer acts to accelerate dissolution of said film unexposed to said radiation source.

67. The method of claim 66, wherein said co-monomer comprises a carboxylic acid.

68. The method of claim 67, wherein said co-monomer comprises at least one of an acrylic acid and methacrylic acid.

69. The method of claim 31, wherein the substrate comprises at least one of a silicon wafer, a photolithographic mask blank, and a printed circuit board.

* * * * *

UNITED STATES PATENT AND TRADEMARK OFFICE
CERTIFICATE OF CORRECTION

PATENT NO. : 6,806,026 B2
DATED : October 19, 2004
INVENTOR(S) : Allen et al.

It is certified that error appears in the above-identified patent and that said Letters Patent is hereby corrected as shown below:

Column 8,
Lines 1-10, replace the bottom-most "$R^5$" with -- $R^6$ --.

Column 23,
Line 15, before "comprising" and after "polymer" delete "said polymer".

Signed and Sealed this

Twenty-seventh Day of September, 2005

JON W. DUDAS
*Director of the United States Patent and Trademark Office*